United States Patent [19]

Nicewarner, Jr.

[11] Patent Number: 5,491,612
[45] Date of Patent: Feb. 13, 1996

[54] THREE-DIMENSIONAL MODULAR ASSEMBLY OF INTEGRATED CIRCUITS

[75] Inventor: Earl R. Nicewarner, Jr., Gaithersburg, Md.

[73] Assignee: Fairchild Space and Defense Corporation, Germantown, Md.

[21] Appl. No.: 393,922

[22] Filed: Feb. 21, 1995

[51] Int. Cl.[6] .................................................. H05K 7/02
[52] U.S. Cl. ......................... 361/760; 361/735; 361/790; 361/749; 257/686; 257/778; 257/787
[58] Field of Search .................................. 257/685–686, 257/723–724, 777–778, 787; 361/760–762, 790, 735–736, 748–749, 775; 174/260–261; 437/208, 915

[56] References Cited

U.S. PATENT DOCUMENTS 5,067,007 11/1991 Kanji et al. .
5,327,325 7/1994 Nicewarner, Jr. ........................ 257/686

FOREIGN PATENT DOCUMENTS 1303730 12/1989 Japan ........................................ 257/777

Primary Examiner—Bot L. Ledynh
Attorney, Agent, or Firm—Michael W. York

[57] ABSTRACT

An integrated circuit package that includes three base substrate support members. One base substrate support member is rigid and has two sides and the other two base substrate members are flexible and are located adjacent each side of the rigid base substrate support member. Each flexible base substrate support member has an inner surface and a series of flip chips are located between the inner surfaces of the flexible base substrate support members and the sides of the rigid base substrate support member. The three base substrate support members are electrically connected together and a termination connection is provided at one end of the assembly. In addition, logic chips are provided that are located adjacent the connector for controlling the various flip chips.

6 Claims, 4 Drawing Sheets

THREE-DIMENSIONAL MODULAR ASSEMBLY OF INTEGRATED CIRCUITS

BACKGROUND OF THE INVENTION

The increased complexity of spacecraft and aircraft as well as other vehicles has resulted in a need to incorporate more and more electronic systems in such vehicles. However, the complexity has reached a point where the required and desired electronic systems exceed the available space in the vehicle to accept all such systems. In order to overcome this problem, numerous efforts have and are being made to reduce the size of the electronic packages that make up such electronic systems.

Electronic system evolution has followed the trend of producing more functionality in less volume, at lower weight, and lower cost. Improvements in integrated circuit chip density and functionality have mostly contributed toward improved efficiency, however, advancements in packaging of these devices have also been beneficial. As it becomes more difficult to achieve substantial improvements through integrated circuit technology advances, new packaging approaches have become necessary to obtain density improvements and to allow the full performance potential of interconnected chips to be used.

The term "chip" in this description refers to an electrically functional integrated circuit die. The active face of the chip is defined as the surface on which the integrated electronics have been disposed. The back side refers to the surface opposite the active face.

It is known to place an integrated circuit chip in a plastic package for protection and then solder the package to a substrate. Typical integrated circuit packages contain only one chip. The package is substantially larger than the chip, thereby limiting the overall packaging density. Conventional packaging systems employing printed circuit boards with single chip packages are unable to provide the required number of chips within a volume and weight which is compatible with the needs of advanced circuit applications.

The present invention relates to integrated circuitry packaging to increase its functional density, through use of a three-dimensional assembly arrangement, and to reduce material and assembly costs. Applications which require large memory capacity suffer from excessive packaging overhead when single chip packages are used.

This invention provides for the disposition of chips in a three dimensional configuration. This invention includes multiple arrays of stacked chips contained on both sides of a substrate. The techniques of this invention are applicable for use with any form of commercially available memory chip.

A three dimensional integrated circuit assembly is provided to solve the foregoing problems that includes a primary substrate with integrated circuit chips and means for allowing mechanical and electrically functional attachment of integrated circuit chips to both sides of the substrate using flip chip assembly techniques. In addition, one or more secondary substrates are provided comprising a printed flexible wiring substrate with a means for allowing mechanical and electrically functional attachment of integrated circuit chips to one side of the flexible substrate using flip-chip assembly techniques. The back sides of the chips on both the primary and secondary substrates are aligned and bonded together so as to allow additional use of the vertical space above or below the primary substrate. This creates a three dimensional arrangement of chips for more effective use of substrate area and allows more chips to be contained in a given volume. The secondary substrate additionally provides an interconnect to the primary substrate for its stacked chips through printed circuitry and termination leads to the primary substrate. The circuit packages described herein increase the density (volumetric efficiency) over existing approaches in order to provide higher density, lower weight, and improved functional performance for electronic systems.

SUMMARY OF THE INVENTION

This invention relates to the packaging of electronic circuits and more particularly to the packaging of electronic circuitry that uses less volume.

Accordingly, it is an object of the invention to provide an electronic circuit package with reduced volume and lower cost.

It is an object of the invention to provide an integrated circuit package that provides increased functionality with reduced volume.

It is an object of the invention to provide an integrated circuit package with increased functional density.

It is an object of the invention to provide an integrated circuit package that is well suited for use in circuits where the volume available for the circuit is limited.

It is an object of the invention to provide an integrated circuit package that is well suited for use in a variety of difficult situations.

It is an object of the invention to provide an integrated circuit package that permits multiple integrated circuits to be packaged in the same size of package that would contain fewer integrated circuit chips.

It is an object of the invention to provide an integrated circuit package that is adapted for use with a wide variety of available chips.

It is an object of the invention to provide an integrated circuit package that is adapted for use with any form of commercially available chip.

It is also an object of the invention to provide an integrated circuit package that creates a three dimensional assembly of chips.

It is an object of the invention to provide an integrated circuit package that allows attachment of integrated circuit chips to both sides of substrates.

It is an object of the invention to provide an integrated circuit package that is configured to allow additional use of the space above or below a substrate.

It is an object of the invention to provide an integrated circuit package that effectively increases the packaging density by many times over existing packaging techniques.

It is an object of the invention to provide an integrated circuit package assembly with special means for mounting, stacking, and functionally interconnecting chips so as to provide increased functional density.

It is also an object of the present invention to provide an integrated circuit package with means for attaching integrated circuits to a substrate which optimizes package and chip density.

It is another object of the invention to provide an integrated circuit package that uses novel packaging technology to provide a high density package for chips useful for a variety of applications.

It is still another object of this invention to provide an integrated package which is suitable for use with standard commercial chips of various dimensions.

It is a further object of this invention to provide an integrated circuit package with efficient means for the interconnection of the chips in a high density package.

These and other objects will be apparent from the integrated circuit package invention that has three base substrate support members that each have an upper and a lower surface. Two of the three base substrate support members are flexible and one is rigid. The three base substrate support members are connected together with the rigid base substrate support member located between the flexible base substrate support members. Circuit chips that are connected together in back to back relationship are located between the lower surface of the upper flexible base substrate support member and the upper surface of the rigid base substrate support member and circuit chips that are connected together in back to back relationship are located between the upper surface of the lower flexible base substrate support member and the lower surface of the rigid base substrate support member. The circuit chips that are connected together in back to back relationships on the upper and lower surfaces of the rigid base substrate support member are electrically connected together.

BRIEF DESCRIPTION OF THE DRAWINGS

The invention will be hereinafter more fully described with references to the accompanying drawings in which.

DETAILED DESCRIPTION OF THE PREFERRED EMBODIMENT

Many of the techniques disclosed in this detailed description of the invention are exemplary only, and it should be clear to one skilled in the art that alternate techniques may be employed in practicing this invention. Further, other techniques which are peripheral to the invention and well known in the art, such as how to fabricate a printed wiring board, flexible printed wiring, or ceramic substrate, are not disclosed so as to prevent obscuring the invention in unnecessary detail.

In order to increase the density of current substrates using integrated circuit chips, the present invention uses a technique for creating a three-dimensional packaging arrangement of back-to-back chips on both sides of a substrate as shown in FIGS. 1–4 and as will be hereinafter described in detail.

Figure 1:
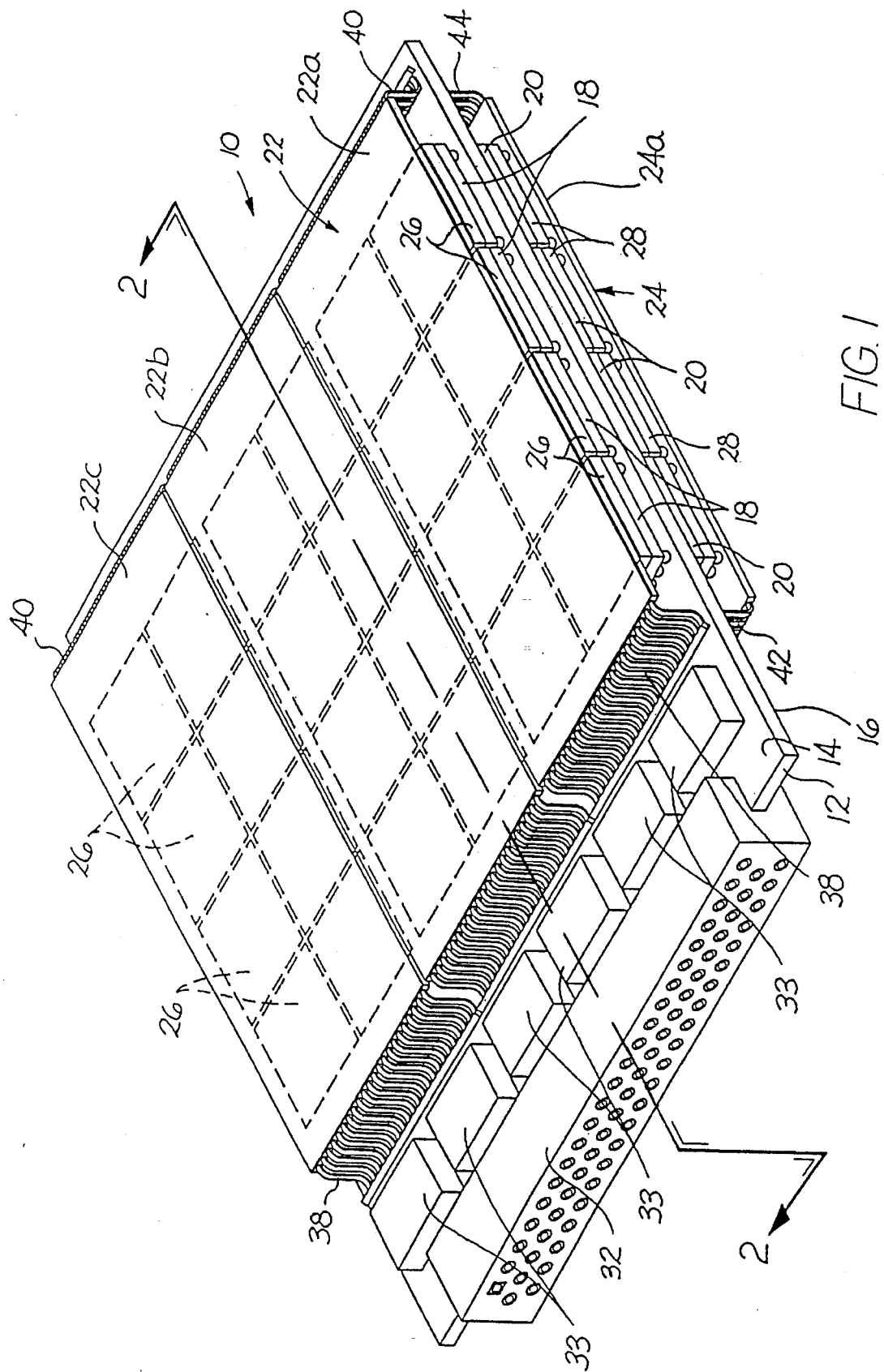
FIG. 1 is a perspective view of the three dimensional circuit package assembly invention.

Referring first to FIG. 1 the circuit package invention is illustrated and is designated by the number 10. The circuit package 10 comprises a primary substrate 12 which is generally rectangular in shape and has an upper side surface 14 and a lower side surface 16 and is made using the known multilayer approach for fabricating a printed wiring board or ceramic thick film or cofired ceramic substrate which is extended by adding appropriate circuitry layers. The primary substrate 12 may be formed of any material suitable for electronic packaging including, but not limited to alumina, aluminum nitride, silicon, mullite, glass ceramic, or aramid or glass fiber reinforced polyimide or epoxy. A material possessing low expansion characteristics, which nearly matches the expansion characteristic of the silicon chip, is desired to provide long term reliability of the flip chip solder connections under various temperature environments. The primary substrate 12 has respective identical chips 18 and 20 located on its respective sides or surfaces 14 and 16.

Figure 3:
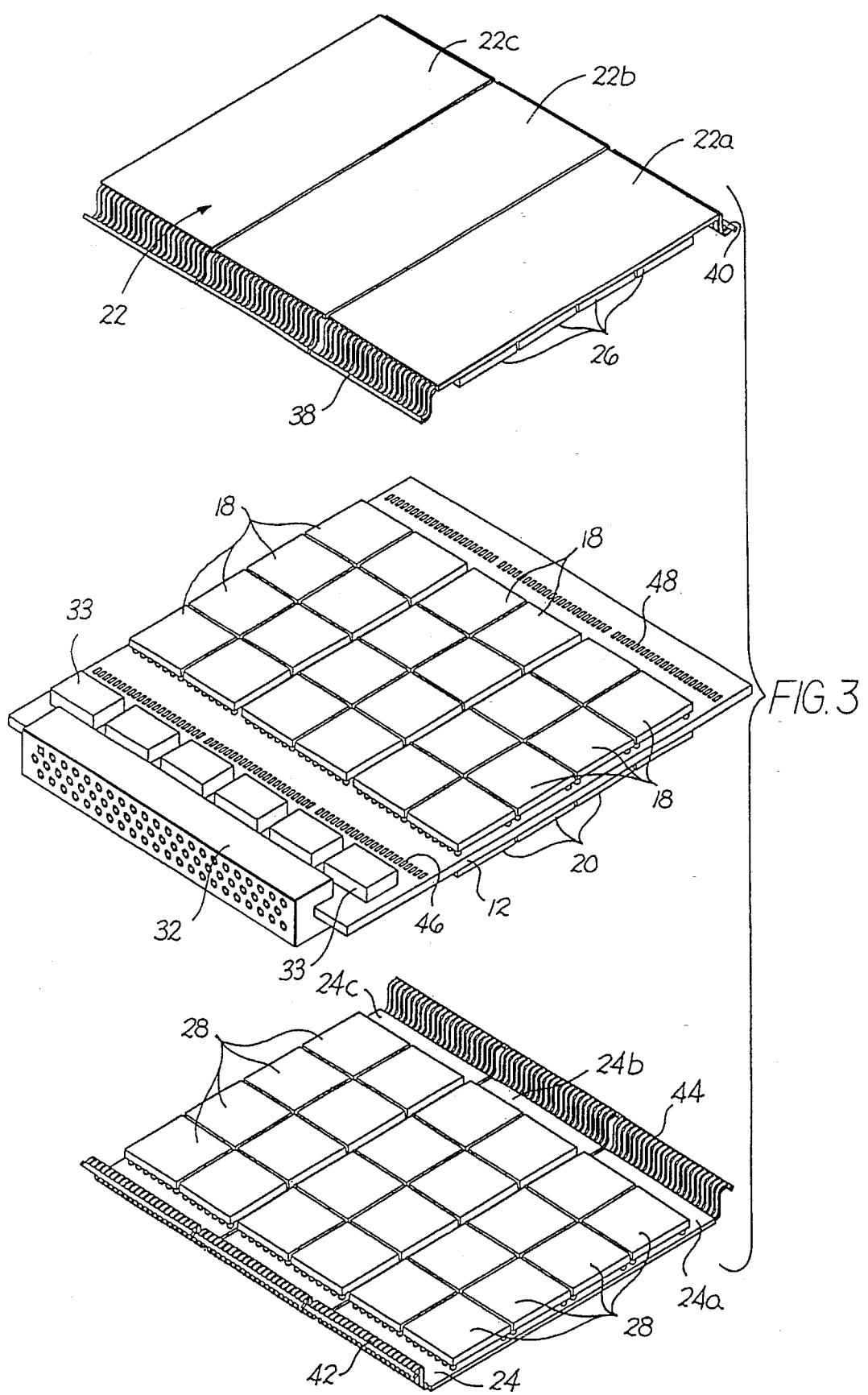
FIG. 3 is a partly exploded perspective view of the of the three dimensional circuit package assembly invention set forth in FIG. 1.
Figure 4:
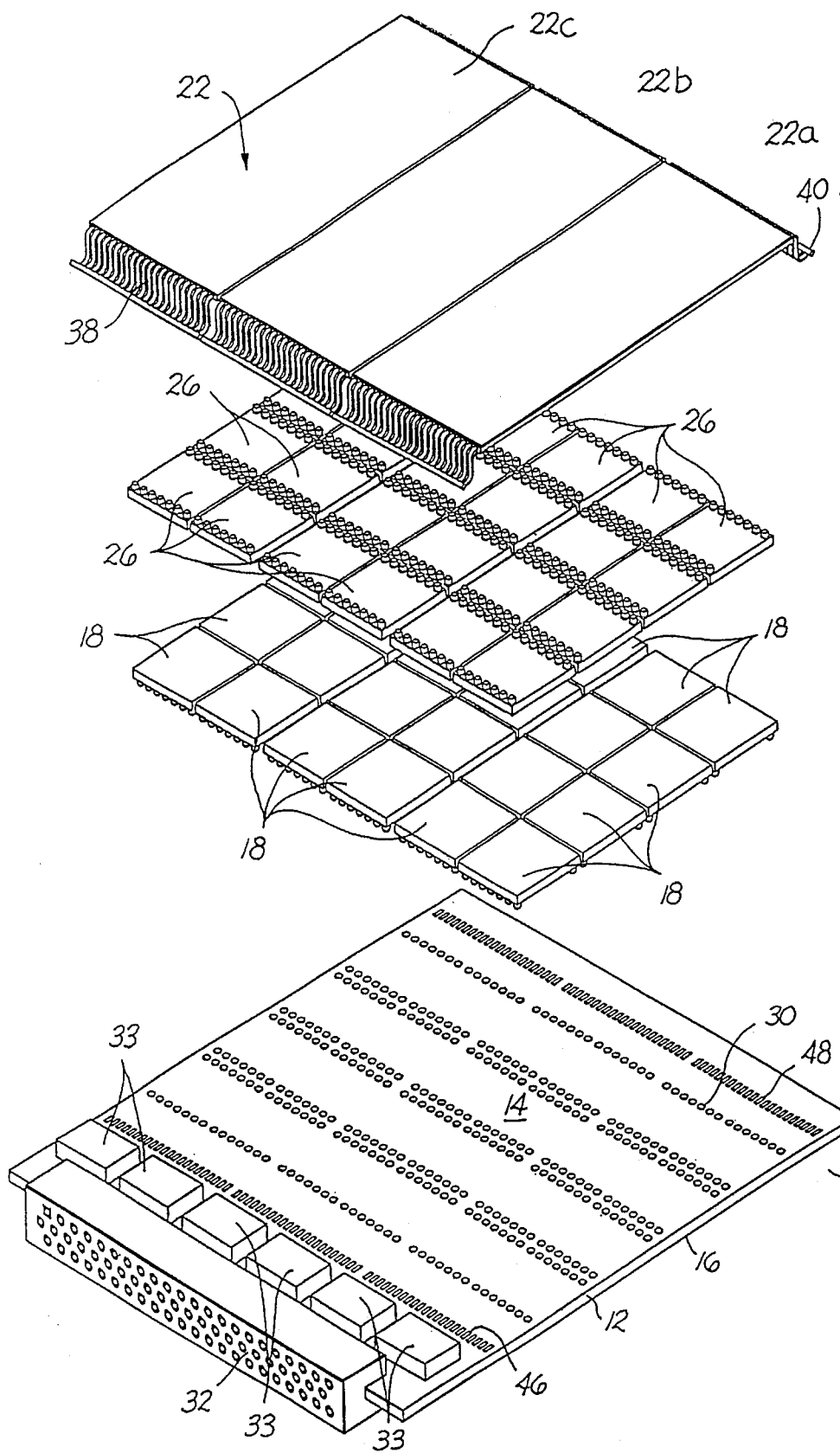
FIG. 4 is an enlarged exploded perspective view of a portion of the three dimensional circuit package assembly invention illustrated in FIG. 3.

The circuit package 10 also comprises the two thin external secondary substrates 22 and 24 that are located adjacent to and in close proximity to the respective sides 14 and 16 of the primary substrate 12. These secondary substrates 22 and 24 each have three portions or segments designated respectively as 22a, 22b, 22c and 24a, 24b, 24c as best illustrated in FIGS. 1 and 3. These secondary substrates 22 and 24 are dedicated to interface and perform an electrical coupling with respective functional identical chips 26 and 28. Each of these layers of chips 18 and 20 uses solderable or bondable metallizations such as those designated 30 (FIG. 4) in a conventional manner and appropriately located for direct attachment of the chips using flip chip attachment techniques. Flip chip is a known attachment method that occurs when the chips are directly attached using solder (or conductive polymer adhesive) to a mirror image conductive pattern on the substrate. The conductive interface pattern consists of an array of conductive pads with similar size to bond pads on the chip. Typical chip bond pad size is 0.002–0.006 of an inch and the corresponding substrate bond pads are the same or close to the same size.

Interconnects between the chips 18 and 20 and to the primary substrate termination connector 32 are provided by conventional internal vias and internal or external layers with conductive traces (not shown) that are incorporated into the printed wiring board or ceramic substrate of the primary substrate 12 in a conventional manner. A series of conventional logic chips 33 and 35, in pairs, are also provided on the respective primary substrate surfaces 14 and 16 for controlling the memory chip arrays that will be hereinafter described.

Figure 2:
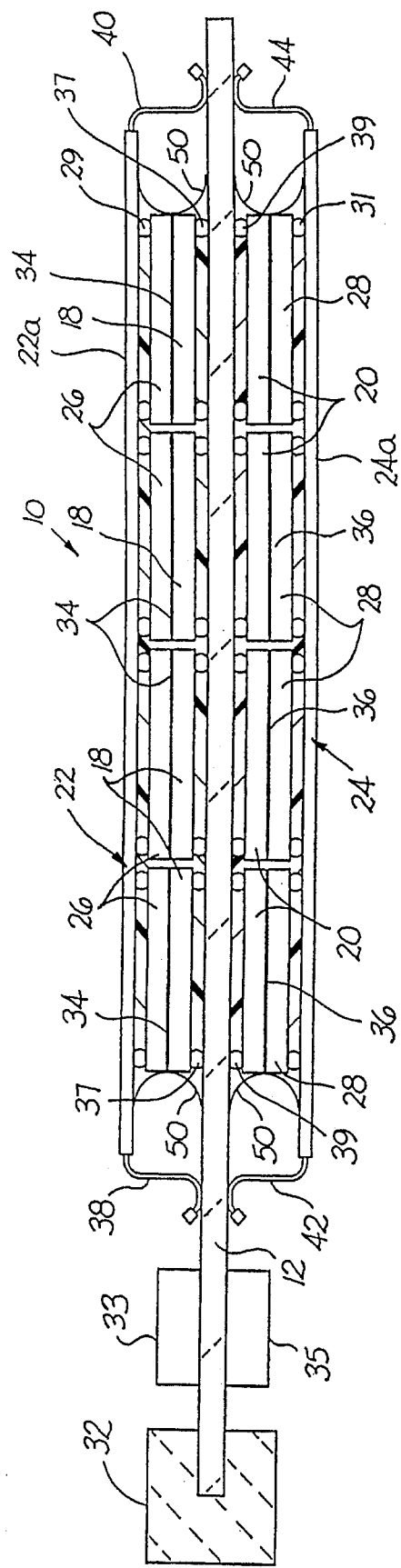
FIG. 2 is a sectional view of the three dimensional circuit package assembly invention taken on the line 2—2 of FIG. 1, but also indicating an alternative of using an encapsulating material.

The circuit package invention 10 that comprises one or more substantially identical secondary substrates 22 and 24, as best illustrated in FIGS. 1, 2 and 3, form a three dimensional arrangement when assembled with the primary substrate subassembly 12. The respective secondary substrates 22 and 24 with their respective chips 26 and 28 use an identical array of chips as was used on the primary substrate 12 in order to allow the secondary substrate/chip subassembly to be bonded with an epoxy film adhesive or liquid epoxy bonding compound 34 and 36 in a back to back relationship to the respective chips 18 and 20 on the primary substrate 12 as best illustrated in FIG. 2. The secondary substrates 22 and 24 comprise a flexible nonreinforced polyimide film material, such as Kapton available from Dupont, and the respective chips 26 and 28 are attached using flip chip attachment techniques to the respective flexible circuit substrate 22 and 24 conductive patterns using solder or conductive adhesive 29 and 31. In a similar manner the respective chips 18 and 20 are attached to the primary substrate 12 using solder or conductive adhesive 37 and 39.

As illustrated in FIGS. 1 through 4, the secondary substrates 22 and 24 have respective conductive leads 38, 40 and 42, 44 that extend from the respective flexible substrates 22 and 24 and are formed to overlay corresponding attachment land arrays 46 and 48 (FIGS. 3 and 4) and corresponding land arrays (not shown) on the other side of the primary substrate 12. The flexible circuit leads 38 and 40 are soldered to or conductive adhesive attached to corresponding lands such as 46 and 48 on the central primary substrate 12 to complete the required electrical connections.

An additional optional configuration illustrated in FIG. 2 provides the flip chip solder bump connections with an encapsulating epoxy resin 50, such as Dexter Hysol FP4510 available from Dexter Electronics Materials Division of Dexter Corp. of Industry, California or other similar low expansion, low modulus curable resin. This resin 50 improves fatigue life of the solder connections 29, 31, 37 and 39 when the packaged assembly 10 is exposed to temperature cycling as well as provides additional support for the lower and upper chips 18, 20, 26 and 28 during the chip attachment operation. This invention provides for a four high (two on each side of the substrate) stack of chips 18, 20, 26 and 28 assembled back to back in a double sided arrangement of stacked chips on a substrate.

The invention 10 is made and used in the following manner. An illustrative example of how the present packaging invention 10 is made follows for forming a 96 megabit static RAM module which is suitable for a memory storage module application. The chips selected for this example are 128K by 8 SRAMs. In order to achieve a 96 megabit module, 96 chips are required. The chips are arranged in a 4×6 pattern consisting of 3 sets of 2×4 arrays. Since each pattern location is composed of 4 layers of chips, the total assembly contains 96 chips. This example of 96 chips can be extended to chip arrays of any practical size.

The fabrication and assembly approach is as follows:

1. A primary substrate printed wiring board such as that designated 12 is fabricated from conventional material, such as epoxy glass, with custom interface patterns for flip chip electrical interconnect to the memory chips such as those designated 18 and 20 as well as required internal interconnections necessary to produce an electrically functional module. Provisions are made in the primary substrate for attaching the additional logic chips 33 for controlling the memory chip arrays in a conventional manner. A connector 32 also provides means for external interface of the memory module assembly. An aramid fiber or other similar reinforcement material may be used to provide a close match between the coefficient of expansion of the chips 18 and 20 and the substrate 12 material.

2. The illustrative example here is for use with a memory chip containing 32 chip interconnect locations. The 96 chips are arranged in 4×6 arrays which are stacked and located on both sides of the substrate forming a four high configuration of chips 18, 20, 26 and 28 at any location. Each of the 4×6 arrays is further subdivided into a 2×4 array for interconnect using a secondary flexible circuit substrate 22 or 24. The flexible circuit substrate circuitry required is configured such that all but one of the 32 interconnect locations per chip are common to each other. The one unique connection for chip select function requires a separate output termination for each chip. The flexible circuit substrates 22 and 24 are designed to terminate with the required respective leads 38, 40 and 42, 44 for connection to the primary substrate 12 along one or two edges.

3. Integrated circuit chips 18 and 26 and 20 and 28 which are to be mounted using flip chip technique are prepared, using known art, with solder bumps of Sn63Pb37 solder alloy or similar solder alloy at the attachment pads.

3a. Alternately, a conductive adhesive polymer material, such as EPO-TEK H2OE-PFC available from Epoxy Technology, Inc., Ballerica, Mass., can be used to perform the same electrical and mechanical function as solder attachment.

4. Flux is applied to the solder bumped chip or substrate metallizations, if solder is used. Adhesive attachment, of course, requires no flux.

5. Solder or polymer bumped chips 18 are placed onto the upward facing primary substrate 12 with proper alignment between the chip bumps and corresponding interconnect pads on the substrate 12.

6. The assembly using solder bumps is then reflowed using an infrared or convection oven or conduction heating system in an inert gas atmosphere, such as nitrogen, at approximately 210 degrees Centigrade.

6a. An assembly using conduction polymer bumps is cured using an infrared or convection oven or conduction heating system at a time and temperature combination recommended by the material supplier.

7. After reflow and cooling, the assembly is cleaned of flux using a solvent such as xylene or isopropyl alcohol.

8. Steps 3 through 7 are repeated for the second side of the primary substrate 12 and the chips 20.

9. If desired for reliability enhancement, the cavities between the chips 18 and 20 and the primary substrate 12, where the solder bumps 37 and 39 are located, is filled by injecting epoxy resin 50, such as Hysol FP4510, next to the chips 18 and 20. Surface tension will draw the resin 50 under the chips and fill the cavities between the chips 18 or 20 and substrate 12. The resin 50 is then cured by heating the assembly for the time and at the temperature recommended by the resin manufacturer. The resin 50 encapsulates the solder bumps 37 and 39.

10. Additional substrates 22 and 24 made of flexible circuitry are fabricated separately and assembled using flip chip techniques each in a 2×4 array similar to steps 3 through 8 above. Six separate substrates portions are fabricated. These are portions 22a, 22b, 22c and 24a, 24b, 24c of the respective substrates 22 and 24. If desired for reliability enhancement, the cavities between the chips 26 and 28 and the respective secondary substrates 22 and 24, where the respective solder bumps 29 and 31 are located, is filled by injecting epoxy resin 50, such as Hysol FP4510, next to the chips 26 and 28. Surface tension will draw the resin 50 under the chip 26 or 28 and fill the cavity between the chip and the substrate 22 or 24. The resin 50 is then cured by heating the assembly for the time and at the temperature recommended by the resin manufacturer. The resin 50 encapsulates the solder bumps 29 and 31.

11. The six assembled secondary flexible circuit substrate portions 22a, 22b, 22c and 24a, 24b, 24c that form the substrates 22 and 24 are then bonded to the back of the primary substrate 12 assembly such that the associated chips are aligned in a back to back arrangement. Three assembled secondary flexible circuit portions 22a, 22b, 22c or 24a, 24b, 24c are bonded at one time using adhesive such as that designated 34 and 36 between the backs of the secondary assembly chips 26 and 28 and the backs of the primary substrate chips 18 and 20. The adhesive material 34 and 36 used between chips is an epoxy die attach adhesive or similar material used for die attachment purposes. The primary substrate 12 is inverted and this step is repeated using the other secondary flexible circuit substrate subassemblies.

12. The terminating leads 38, 40 and 42, 44 of each of the secondary flexible circuits are then soldered to or attached with conductive adhesive to the primary substrate attachment lands 46 and 48 using reflow or bonding techniques.

The assembled circuit package invention 10 can then be used in a conventional manner. However, due to the high density of chips, the invention 10 is suitable for use in many applications where other circuit packaging techniques would not work.

Although the invention has been described in considerable detail with reference to a certain preferred embodiments it will be appreciated and understood that various changes and modifications may be made without departing from the spirit and scope of the invention as defined in the appended claims.

What is claimed is:

1. An integrated circuit module assembly comprising a primary base substrate support member having two sides, two secondary base support members each having an inner and an outer side with one secondary base support member being located with the inner side thereof located adjacent to and in close proximity to one side of said primary base substrate support member and the other secondary base support member being located with the inner side thereof located adjacent to and in close proximity to the other side of said primary base substrate support member, at least one flip chip combination in a back to back relationship located between the inner side of said secondary base support members and the adjacent side of said primary base substrate support member, electrical connecting means for connecting at least one secondary base support member to said primary base substrate support member and wherein at least one of said base substrate support members is flexible.

2. The integrated circuit module assembly of claim 1 further comprising chip electrical connecting means for connecting at least one chip to said primary base substrate support member.

3. The integrated circuit module assembly of claim 2 further comprising chip electrical connecting means for connecting at least one chip to said secondary base support member.

4. The integrated circuit module assembly of claim 3 further comprising a connector operatively associated with said primary base substrate support member.

5. The integrated circuit module assembly of claim 4 further comprising encapsulation means for encapsulating at least a portion of at least one of said chips.

6. The integrated circuit module assembly of claim 4 further comprising logic means operatively associated with at least one of said chips for controlling said chip.

* * * * *